United States Patent
Kurita et al.

(10) Patent No.: US 8,528,762 B2
(45) Date of Patent: Sep. 10, 2013

(54) ELECTRON BEAM WELDING OF LARGE VACUUM CHAMBER BODY HAVING A HIGH EMISSIVITY COATING

(75) Inventors: Shinichi Kurita, San Jose, CA (US);
Mehran Behdjat, San Jose, CA (US);
Makoto Inagawa, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1064 days.

(21) Appl. No.: 12/534,534

(22) Filed: Aug. 3, 2009

(65) Prior Publication Data

US 2010/0122982 A1   May 20, 2010

Related U.S. Application Data

(60) Provisional application No. 61/114,871, filed on Nov. 14, 2008.

(51) Int. Cl.
*B65D 6/28* (2006.01)

(52) U.S. Cl.
USPC ............... 220/4.01; 220/23.86; 220/694

(58) Field of Classification Search
USPC ............... 220/4.01, 4.26, 23.86, 694, 729;
204/192.1, 298.01; 219/121.14, 121.13;
414/217
See application file for complete search history.

(56) References Cited

U.S. PATENT DOCUMENTS

| | | | |
|---|---|---|---|
| 5,973,447 A | 10/1999 | Mahoney et al. | |
| 6,086,734 A | 7/2000 | Harada | |
| 7,073,834 B2 | 7/2006 | Matsumoto et al. | |
| 7,845,891 B2 * | 12/2010 | Lee et al. | 414/217 |
| 2002/0178562 A1 | 12/2002 | Aoki et al. | |
| 2005/0150757 A1 * | 7/2005 | Black et al. | 204/192.1 |

FOREIGN PATENT DOCUMENTS

| | | |
|---|---|---|
| JP | 05-263935 A | 10/1993 |
| JP | 08-064542 A | 3/1996 |
| JP | 2003-117655 A | 4/2003 |

OTHER PUBLICATIONS

International Search Report and Written Opinion for PCT/US2009/063671 dated May 31, 2010.
Office Action for Chinese Patent Application No. 200980145539.3 dated Oct. 9, 2012.

* cited by examiner

*Primary Examiner* — Mickey Yu
*Assistant Examiner* — Kareen Rush
(74) *Attorney, Agent, or Firm* — Patterson & Sheridan, LLP

(57) ABSTRACT

Embodiments disclosed herein relate to a large vacuum chamber body that has been welded together. The chamber body may have a high emissivity coating on at least one surface therein. Due to the large size of the chamber body, the chamber body may be formed by welding several pieces together rather than forging the body from a single piece of metal. The pieces may be welded together at a location spaced from the corner of the body, which may be under the greatest stress during evacuation, to ensure that the weld, which may be the weakest point in the body, does not fail. At least one surface of the chamber body may be coated with a high emissivity coating to aid in heat transfer from incoming, heated substrates. The high emissivity coating may increase substrate throughput by lowering the time that may be needed to reduce the substrate temperature.

15 Claims, 7 Drawing Sheets

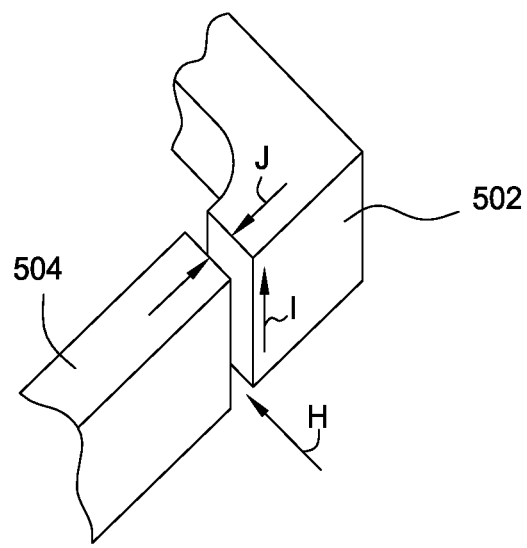
FIG. 5A
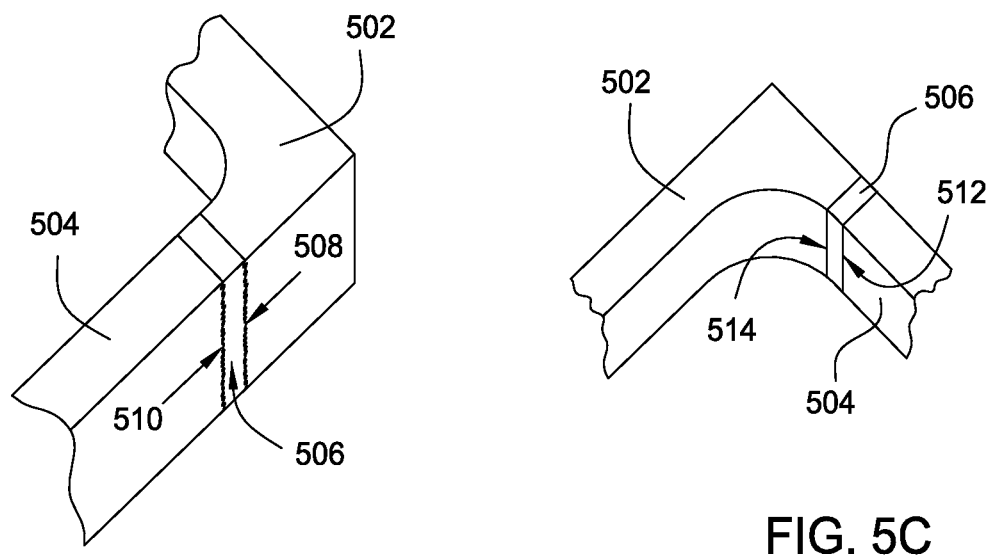
FIG. 5B
FIG. 5C

ELECTRON BEAM WELDING OF LARGE VACUUM CHAMBER BODY HAVING A HIGH EMISSIVITY COATING

CROSS-REFERENCE TO RELATED APPLICATIONS

This application claims benefit of U.S. Provisional Patent Application Ser. No. 61/114,871, filed Nov. 14, 2008, which is herein incorporated by reference.

BACKGROUND OF THE INVENTION

1. Field of the Invention

Embodiments disclosed herein generally relate to a large vacuum chamber body that has a high emissivity coating to increase heat transfer from the incoming substrate and to a large area vacuum chamber body that is electron beam welded together.

2. Description of the Related Art

To introduce a substrate to a vacuum environment from atmosphere, a substrate may pas through a load lock chamber. To prevent radical pressure changes, it may be beneficial to have the load lock chamber vented to atmosphere when the substrate is inserted into the load lock chamber from outside the processing system and evacuated after the substrate is placed therein. Substrates that may pass through a load lock chamber before being processed include semiconductor wafers, flat panel display substrates, solar panel substrates and organic light emitting display substrates.

Substrate throughput is always a concern. Industry has always looked for ways to increase substrate throughput and lessen facility downtime. The faster that a substrate can be processed, the more substrates that can be processed per hour. The processes performed on the substrates affect the substrate throughput, but what occurs between processing also affects substrate throughput. For example, the amount of time that it takes for the substrate to be placed into a chamber affects the substrate throughput. Thus, even the load lock chamber affects substrate throughput because the load lock chamber, as mentioned above, may be maintained in a vacuum state to prevent radical pressure changes. However, the load lock chamber also may interface with atmosphere when the substrates are placed into the load lock chamber. Thus, the load lock chamber may change from a vacuum state to a vented state which takes time. Therefore, the load lock chamber affects substrate throughput.

Therefore, there is a need in the art for a load lock chamber capable of increasing substrate throughput.

SUMMARY OF THE INVENTION

Embodiments disclosed herein relate to a large vacuum chamber body that has been welded together. The chamber body may have a high emissivity coating on at least one surface therein. Due to the large size of the chamber body, the chamber body may be formed by welding several pieces together rather than forging the body from a single piece of metal. The pieces may be welded together at a location spaced from the corner of the body, which may be under the greatest stress during evacuation, to ensure that the weld, which may be the weakest point in the body, does not fail. At least one surface of the chamber body may be coated with a high emissivity coating to aid in heat transfer from incoming, heated substrates. The high emissivity coating may increase substrate throughput by lowering the time that may be needed to reduce the substrate temperature.

In one embodiment, a load lock chamber body is disclosed. The chamber body comprises a plurality of pieces coupled together to collectively form the chamber body having an inside surface with four corners. The chamber body additionally comprises a first piece, a second piece, a third piece and a fourth piece. The first piece comprises a first portion having a first length greater than a first width and a first opening extending therethrough and a first flange extending a first distance from the first portion in a direction substantially perpendicular to the first width. The first flange extends from a first corner of the four corners. The first piece also includes a second flange extending a second distance from the first portion in a direction substantially perpendicular to the first width. The second flange extends from a second corner of the four corners. The second piece is coupled to the first flange and extends in a direction substantially perpendicular to the first width. The third piece is coupled to the second flange and extends in a direction substantially perpendicular to the first width and parallel to the second piece. The fourth piece is coupled to the second piece and the third piece. The fourth piece comprises a second portion a second length greater than a second width and a second opening extending therethrough and a third flange extending a third distance from the second portion in a direction substantially perpendicular to the second width. The fourth piece also includes a fourth flange extending a fourth distance from the second portion in a direction substantially perpendicular to the second width.

In another embodiment, method of fabricating a load lock chamber body having an outside surface and an interior surface having a plurality of corners is disclosed. The method comprises positioning a first piece adjacent a second piece and spaced apart by a gap, radiating an electron beam into the gap and welding the second piece to the first flange. The first piece comprises a first portion having first length and a first width that is less than the first length. The first piece also comprises a first flange extending a first distance from the first portion in a direction substantially perpendicular to the first width such that the first flange and the first portion meet at a first corner of the plurality corners. The first flange is spaced from the second piece by a gap.

In another embodiment, a load lock chamber is disclosed. The chamber includes a top plate, a bottom plate disposed opposite the top plate and a first side plate coupled to the top plate and the bottom plate. The chamber also includes a second side plate coupled to the top plate and the bottom plate and disposed opposite to the first side plate. The chamber also includes a first slit valve plate coupled to the top plate, the bottom plate, the first side plate and the second side plate and having an opening therethrough. The chamber also includes a second slit valve plate coupled to the top plate, the bottom plate, the first side plate and the second side plate. The second slit valve plate is disposed opposite the first slit valve plate and has an opening therethrough. The top plate, the bottom plate, the first and second side plates, and the first and second slit valve plates collectively enclose a chamber volume. The chamber also includes a coating disposed on at least one of the top plate and bottom plate. The coating has a first emissivity that is greater than 0.19 measured at 599 degrees Celsius.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5A is an isometric view of two pieces to be welded together to form a portion of the load lock chamber body.

FIG. 5B is an isometric view of FIG. 5A after the two pieces have been welded together.

FIG. 5C is an isometric view of FIG. 5B from a different angle.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein relate to a large vacuum chamber body that has been welded together. The chamber body may have a high emissivity coating on at least one surface therein. Due to the large size of the chamber body, the chamber body may be formed by welding several pieces together rather than forging the body from a single piece of metal. The pieces may be welded together at a location spaced from the corner of the body, which may be under the greatest stress during evacuation, to ensure that the weld, which may be the weakest point in the body, does not fail. At least one surface of the chamber body may be coated with a high emissivity coating to aid in heat transfer from incoming, heated substrates. The high emissivity coating may increase substrate throughput by lowering the time that may be needed to reduce the substrate temperature.

The embodiments will be described below in regards to a triple slot load lock chamber available from AKT America, Inc., a subsidiary of Applied Materials, Inc., Santa Clara, Calif. While the invention will be described below in regards to a triple slot load lock chamber, it is to be understood that the invention may be practiced in other vacuum chambers including those produced by other manufacturers.

Figure 1:
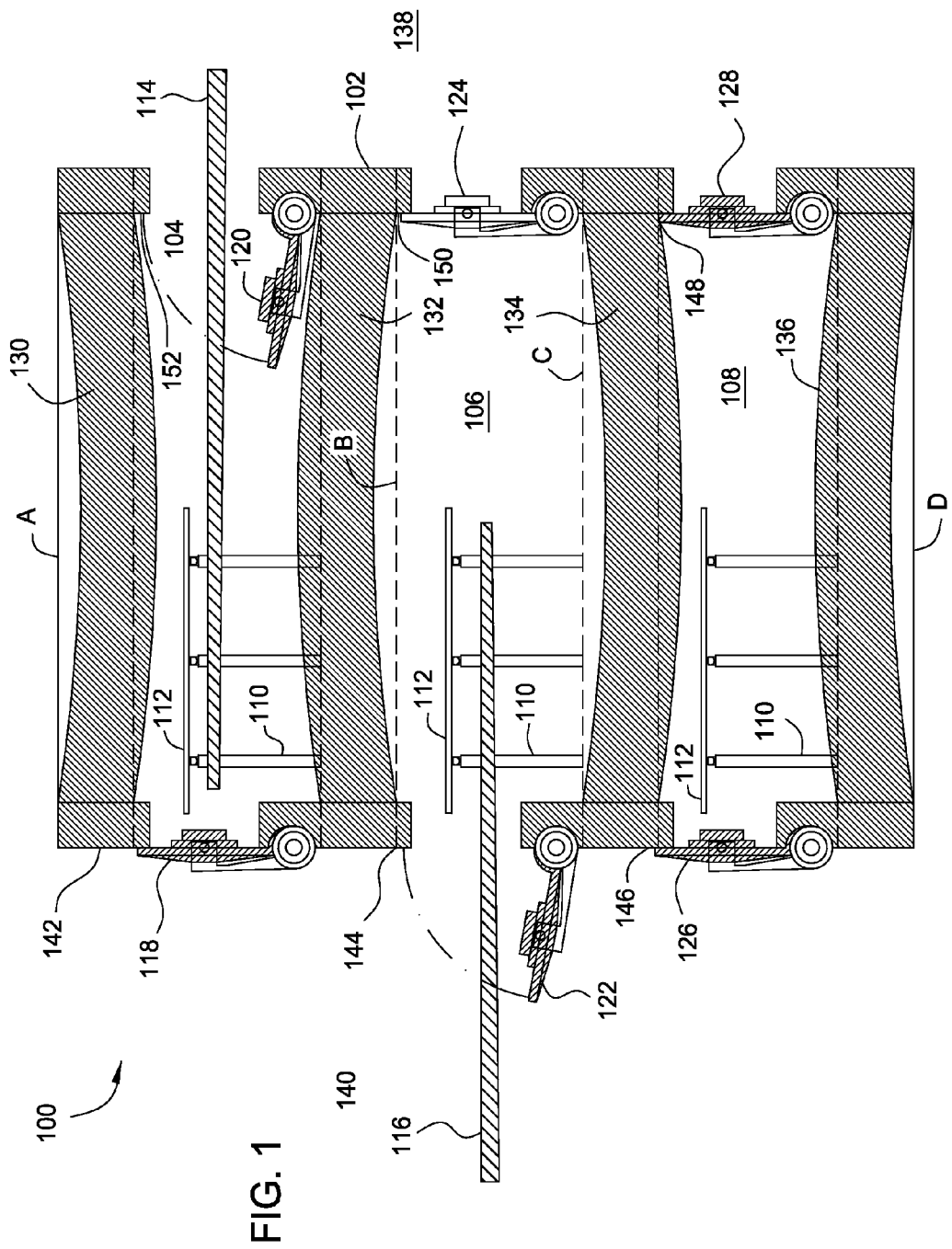
FIG. 1 is a cross sectional view of a triple slot load lock chamber 100 according to one embodiment of the invention.

FIG. 1 is a cross sectional view of a triple slot load lock chamber 100 according to one embodiment. The load lock chamber 100 comprises a chamber body 102 that encloses three separate chamber volumes 104, 106, 108. The chamber volumes 104, 106, 108 may be electrically isolated from one another and be atmospherically isolated from each other.

One chamber volume 104 may have a slit valve door 118 that opens and closes to permit substrates 112 to enter and exit the chamber volume 104 on the atmosphere side 140. Another slit valve door 120 may open and close to permit a substrate 112 to enter and exit the chamber volume 104 on the vacuum side 138. In the embodiment shown in FIG. 1, a robot end effector 114 is shown inside the chamber volume 104 from the vacuum side 138 with the slit valve door 120 open. Because the chamber volume 104 is open to the vacuum side 138, the chamber volume 104 is under vacuum.

Because the chamber volume 104 is under vacuum, the upper wall 130 of the chamber volume 104 may deflect into the chamber volume 104 and away from its normal position indicated by horizontal line "A". Similarly, the bottom wall 132 of the chamber volume 104 may also deflect into the chamber volume 104 and away from its normal position indicated by horizontal line "B". The lift pins 110 are shown in their normal position (i.e., extending from a horizontal bottom surface of the chamber volume 104), however, it is to be understood that the lift pins 110 may deflect with the bottom wall 132 as well.

Another chamber volume 108 may have a slit valve door 126 that opens and closes to permit substrates 112 to enter and exit the chamber volume 108 from the atmospheric side 140. Another slit valve door 128 may open and close to permit a substrate 112 to enter and exit the chamber volume 108 from the vacuum side 138. In the embodiment shown in FIG. 1, the chamber volume 108 is sealed from the atmospheric side 140 and the vacuum side 138 by the slit valve doors 126, 128 which are closed. Thus, the chamber volume 108 may be pumped down to an appropriate vacuum level. In so doing, the chamber walls 134, 136 may deflect into the processing volume 108 and away from their normal position as shown by horizontal lines "C" and "D". The lift pins 110 are shown in their normal position (i.e., extending from a horizontal bottom surface of the chamber volume 104), however, it is to be understood that the lift pins 110 may deflect with the bottom wall 136 as well.

Another chamber volume 106 may have a slit valve door 122 that opens and closes to permit substrates 112 to enter and exit the chamber volume 106 from the atmospheric side 140. The slit valve door 122 is shown open with a robot end effector 116 extending into the chamber volume 106. Because the slit valve door 122 is open on the atmosphere side 140, the chamber volume 106 may be at atmospheric pressure. Another slit valve door 124 may open and close to permit a substrate 112 to enter and exit the chamber volume 104 on the vacuum side 138. Due to the evacuated conditions in chamber volumes 104, 108, the walls 132, 134 of the chamber volume 106 may be deflected away from the chamber volume 106.

When the chamber walls 130, 132, 134, 136 deflect relative to their normal position, the walls 142, 144, 146, 148, 150, 152 to which the slit valve doors 118, 120, 122, 124, 126, 128 seal may also move relative to their normal position. By moving the slit valve doors 118, 120, 122, 124, 126, 128 with the chamber walls 142, 144, 146, 148, 150, 152 when they move, the amount of rubbing between the slit valve doors 118, 120, 122, 124, 126, 128 and the chamber walls 142, 144, 146, 148, 150, 152 may be reduced and thus, particle generation may be reduced.

Figure 2:
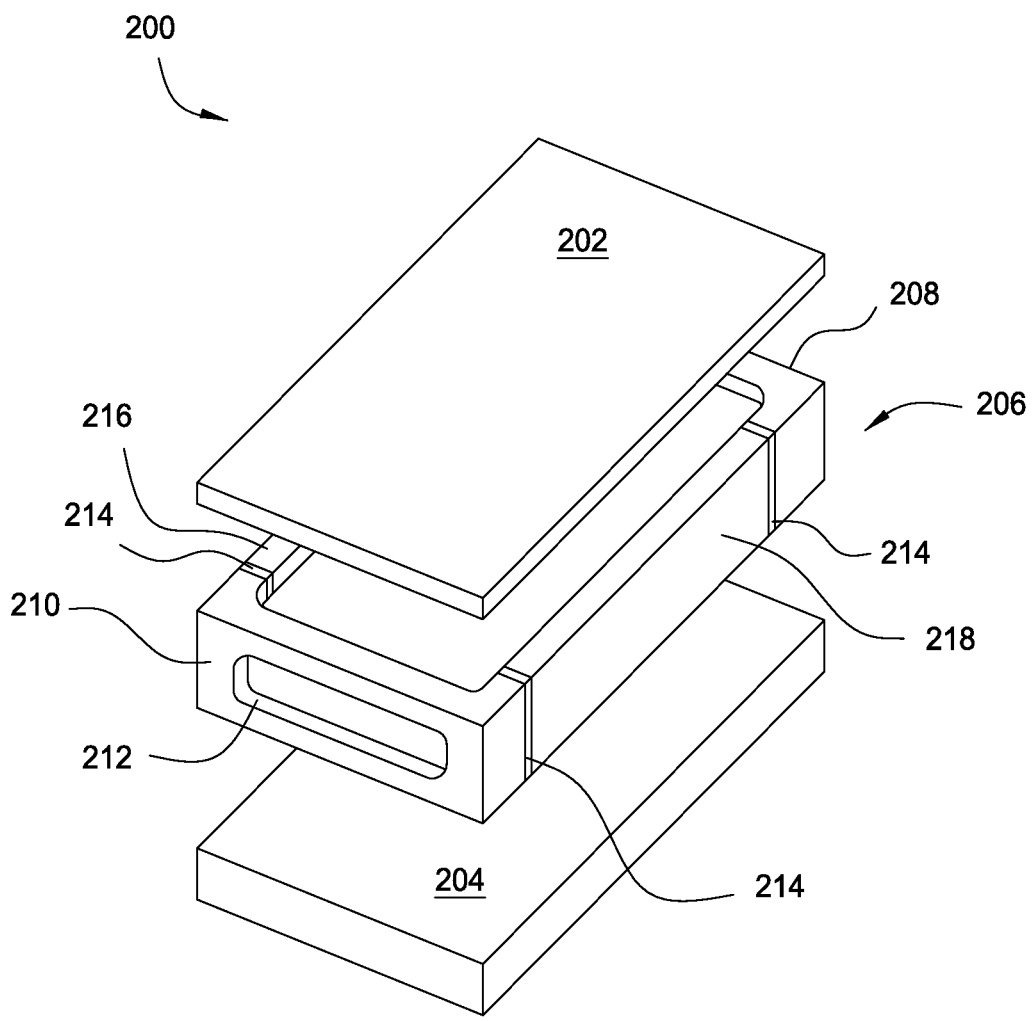
FIG. 2 is an exploded isometric view of a load lock chamber according to one embodiment.

FIG. 2 is an exploded isometric view of a load lock chamber 200 according to one embodiment. The load lock chamber 200 may be quite large. In one embodiment, the load lock chamber may be sized to receive a substrate having a surface area of about 8 square meters or more. It is to be understood that the embodiments discussed herein may be applicable to chambers sized to receive a substrate having a surface area of less than about 8 square meters. Due to the large size, forging the load lock chamber 200 from an ingot may be difficult. Therefore, the load lock chamber 200 may be fabricated from several pieces welded together.

The load lock chamber 200 includes a top plate 202, a bottom plate 204, and a middle section 206. The middle section 206 may include two slit valve plates/end pieces 208, 210 that each may have an opening 212 therethrough to permit a substrate to enter and exit the load lock chamber 200. The end pieces may be connected by side pieces 216, 218. The side pieces 216, 218 may be coupled to the slit valve plates/end pieces 208, 210 by a weld 214.

Figure 3A:
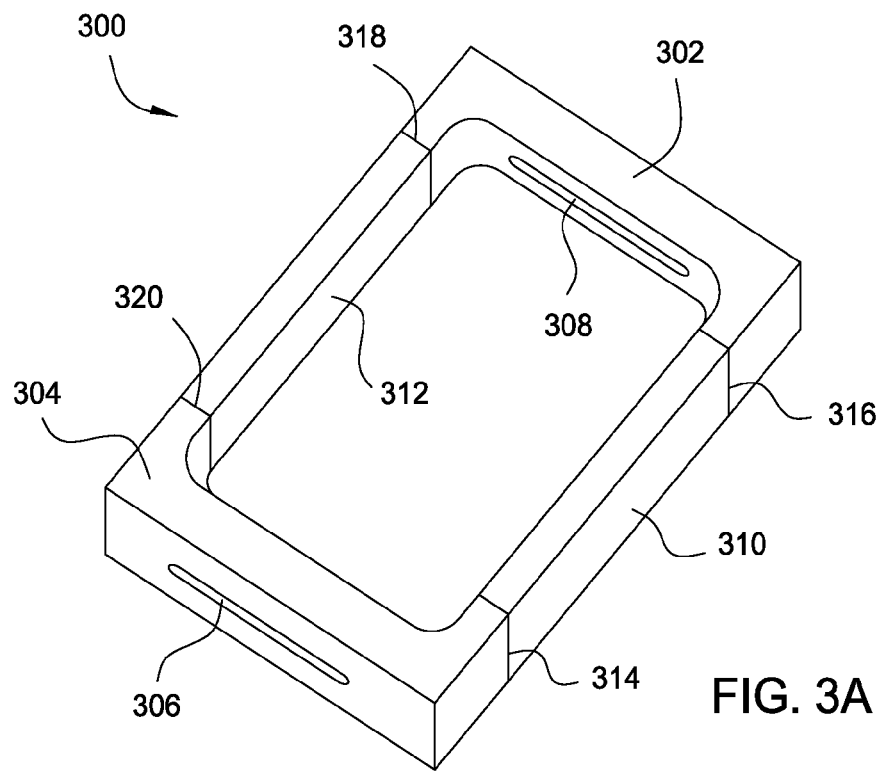
FIG. 3A is an isometric view of a load lock chamber sidewalls coupled together.
Figure 3B:
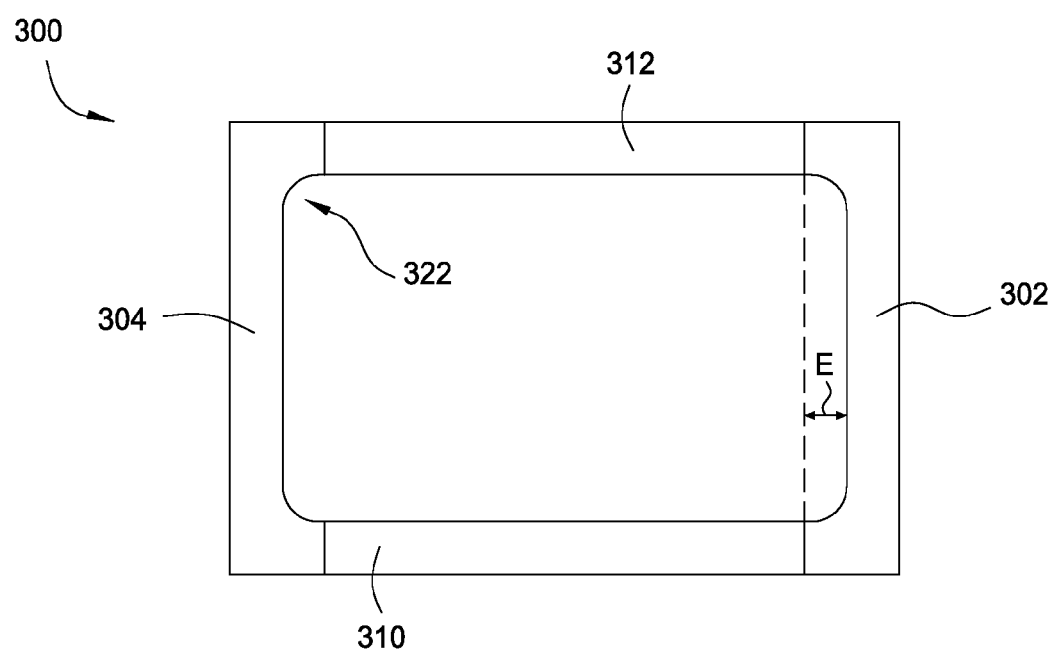
FIG. 3B is a top view of FIG. 3A.

FIG. 3A is an isometric view of a load lock chamber sidewalls coupled together. FIG. 3B is a top view of FIG. 3A. The load lock chamber has a body 300 with slit valve plates/end pieces 302, 304 each having an opening 306, 308 sized to permit a substrate to enter and exit the processing area enclosed by the body 300. Side pieces 310, 312 are welded to the slit valve plates/end pieces 302, 304 by welds 314, 316, 318, 320.

The slit valve plates/end pieces 302, 304 are each forged from a unitary block of material. As shown in FIG. 3B, the end pieces are carved back a distance shown by arrows "E" and have a rounded corner 322 that at least partially bounds the processing area. Due to the carving out of the slit valve plates/end pieces 302, 304, the side pieces 310, 312 are bonded to the slit valve plates/end pieces 302, 304 at locations spaced from the corners 322. In one embodiment, the slit valve plates/end pieces 302, 304 may be carved back about one half inch to about one inch.

Due to the large size of the processing area, portions of the load lock chamber may deflect when a vacuum is drawn in the processing area and when the processing area is vented to atmosphere. The corner 322 will therefore be under the greatest stress as the corners are likely to feel tension from multiple directions. By spacing the location where the side pieces 310, 312 are bonded to the slit valve plates/end pieces 302, 304, the bonding area or welds 314, 316, 318, 320 may be less likely to fail. The welds 314, 316, 318, 320, due to the fact that the welds 314, 316, 318, 320, the side pieces 310, 312, and slit valve plates/end pieces 302, 304 are not collectively a unitary piece of material, would be expected to be the weakest point in the body 300. Thus, moving the weakest point to a location spaced from the greatest stress is beneficial.

The welds 314, 316, 318, 320 may be formed by electron beam welding. Arc welding like TIG or MIG may not be suitable for the thick material that is used for large vacuum chambers. Electron beam welding has a higher energy density than arc welding and enables the welding speed to be faster and deeper with a minimum amount of distortion. A small distortion in electron beams welding enables more rough machining of the slit valve plates/end pieces 302, 304 and side pieces 310, 312 prior to welding. The rough machining, as opposed to finely polished surfaces, reduces machining costs because each slit valve plate/piece 302, 304, 310, 312 is small enough to be machined using a less expensive small machining center as opposed to a large machining facility for making the body 300 out of a unitary material.

In one embodiment, the slit valve plates/end pieces 302, 304 and the side pieces 310, 312 may comprise the same material. In another embodiment, the slit valve plates/end pieces 302, 304 and the side pieces 310, 312 may comprise different material. In one embodiment, the material may comprise aluminum. In another embodiment, the material may comprise anodized aluminum. In another embodiment, the material may comprise stainless steel.

Figure 4:
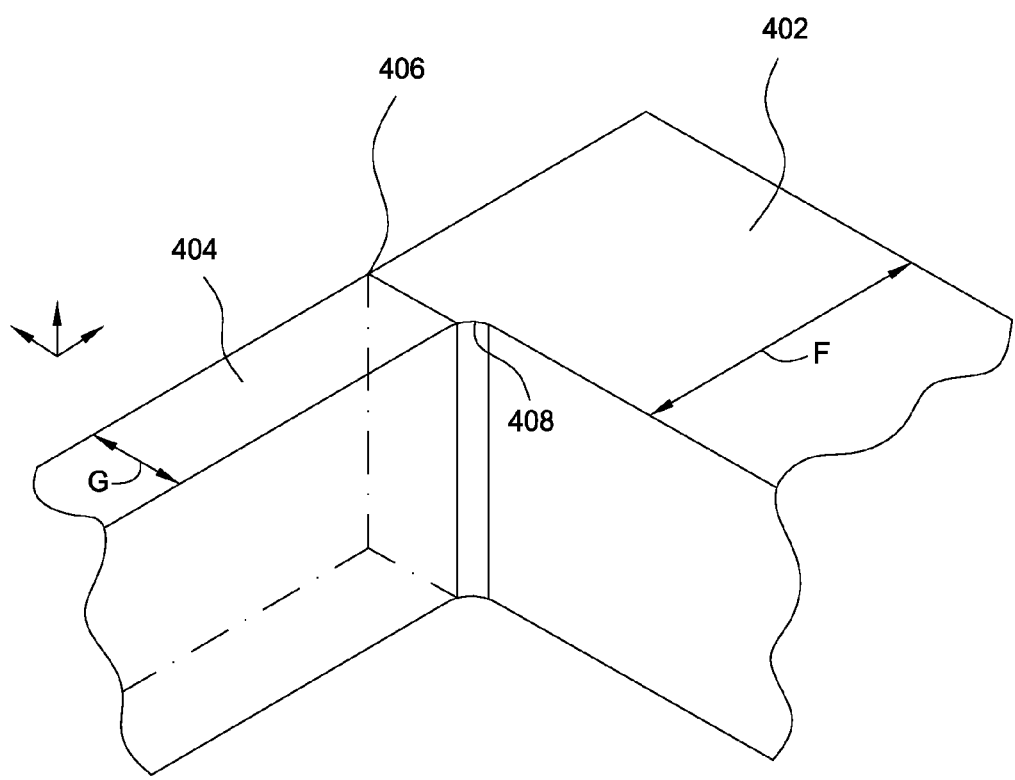
FIG. 4 is an isometric view of the bonding location for a load lock chamber according to one embodiment.

FIG. 4 is an isometric view of the bonding location for a load lock chamber according to one embodiment. The end piece 402 is bonded to the side piece 404 by a weld 406 formed by e-beam welding. The end piece 402 is forged from a piece of material and carved such that the corner 408 that at least partially bounds the processing area has a curved surface. The welding location is disposed greater than about one eighth of an inch from the end of the radius of curvature. By spacing the weld 406 from the corner 408, the stress concentration at the welding area is reduced. Additionally, the depth of the welding is decreased. The end piece 402 is shown to have a greater width as shown by arrows "F" than the width of the side piece 404 as shown by arrows "G". Because the weld 406 is spaced form the corner 408, the side piece 404 may be made as thin as structurally possible.

FIG. 5A is an isometric view of two pieces to be welded together to form a portion of the load lock chamber body. The end piece 502 is initially spaced from the side piece 504 by a distance shown by arrows "J". In one embodiment, the distance "J" may be between about one quarter of an inch to about one half inch. The side piece 504 may be welded to the end piece 502 by electron beam welding. The electron beam may be focused into the gap between the end piece 502 and side piece 504 as shown by arrows "H" at the bottom of the gap and move upwards as shown by arrows "I". As shown in FIG. 5A, the electron beam is focused onto into the gap from outside of the processing area.

FIG. 5B is an isometric view of FIG. 5A after the two pieces have been welded together. FIG. 5C is an isometric view of FIG. 5B from a different angle. As can be seen from FIG. 5B, the outside surfaces of side piece 504 and end piece 502 have a roughened weld 506 at the edges 508, 510 due to the focusing of the electron beam from the outside surface. The other surfaces from which the electron beam was not focused are much smoother and cleaner as shown by the edges 512, 514 on the inside surfaces of the end piece 502 and edge piece 504.

Generation 10 chambers are sized to accommodate substrates that are 2880 mm by 3130 mm, which is quite large. The fabrication processes performed in chambers so large is difficult and pricy. Additionally, fabricating the chambers is difficult. To increase throughput, the load lock chambers may be used to cool down the substrate from temperatures of between about 250 degrees Celsius to about 300 degrees Celsius down to a temperature of between about 100 degrees Celsius to about 150 degrees Celsius while the load lock is vented for a period of between about 45 seconds to about 75 seconds so that the robot on the atmospheric side of the load lock chamber can remove the substrate from the load lock chamber.

The conduction/convection of the venting gas itself, such as nitrogen or argon, may not be sufficient to cool down the substrate to the appropriate temperature due to the high thermal mass and heat transfer by radiation. In other words, the emissivity of the surfaces of the load lock chamber may be a factor in cooling the substrate. To deal with the emissivity issues, the surfaces may be anodized, painted or bead blasted. Most anodizing, bead blasting or painting facilities are not large enough to accommodate a chamber as large as Generation 10 chamber. Therefore, the high emissivity coating disclosed herein is an attractive option.

Vacuum coating technology may be used to absorb a specific wavelength of light. In one embodiment, the coating may comprise aluminum. The high emissivity coating permits the surface area of the chamber to increase by 2000 times as compared to an uncoated surface and controls the emissivity at a wide range of the wavelength of light. The coating may be done on the small parts of the chamber directly or applied by unrolling an aluminum foil that has a pressure sensitive adhesive on the surface that will contact the chamber. The roll may be coated onto the surface of the chamber on site without the need for surface treatments such as anodization, bead blasting or painting and thus may be performed without additional logistical costs. The overall cost may be reduced by ⅓ compared to anodization. Applying an aluminum coating is also ecologically clean and toxic waste free.

The high emissivity coating may contribute to reducing the cool down times by permitting the substrate to cool from a temperature of between about 250 degrees Celsius to about 300 degrees Celsius down to a temperature of between about 100 degrees Celsius to about 150 degrees Celsius in a time of between about 45 seconds to about 75 seconds. In one embodiment, the high emissivity coating may have an emissivity of between about 0.7 to about 0.9. The high emissivity coating may have a thickness of between about 0.3 micrometers to about 14 micrometers. In another embodiment, the high emissivity coating may have a thickness of between about 5 micrometers to about 7 micrometers. In another embodiment, the high emissivity coating may have a thickness of between about 5 micrometers to about 7 micrometers. In another embodiment, the high emissivity coating may have a thickness of between about 7 micrometers to about 14 micrometers. In another embodiment, the high emissivity coating may have a thickness of between about 6 micrometers to about 14 micrometers. In one embodiment, the high emissivity coating may comprise multiple layers. Suitable high emissivity coating may be purchased from Acktar Advanced Coatings, LTD, Israel.

The high emissivity coating may be applied by simply unrolling the coating material from a spool and pressing the coating onto the surface to be coated such that the adhesive side of the coating adheres to the surface to be coated. In one embodiment, the high emissivity coating may be between about 18 cm wide to about 22 cm wide and between about 3.1 meters and about 3.3 meters in length. The high emissivity coating may be applied on all exposed surfaces of the chamber if desired so long as the coating does not interfere with the operations of the chamber.

Figure 6:
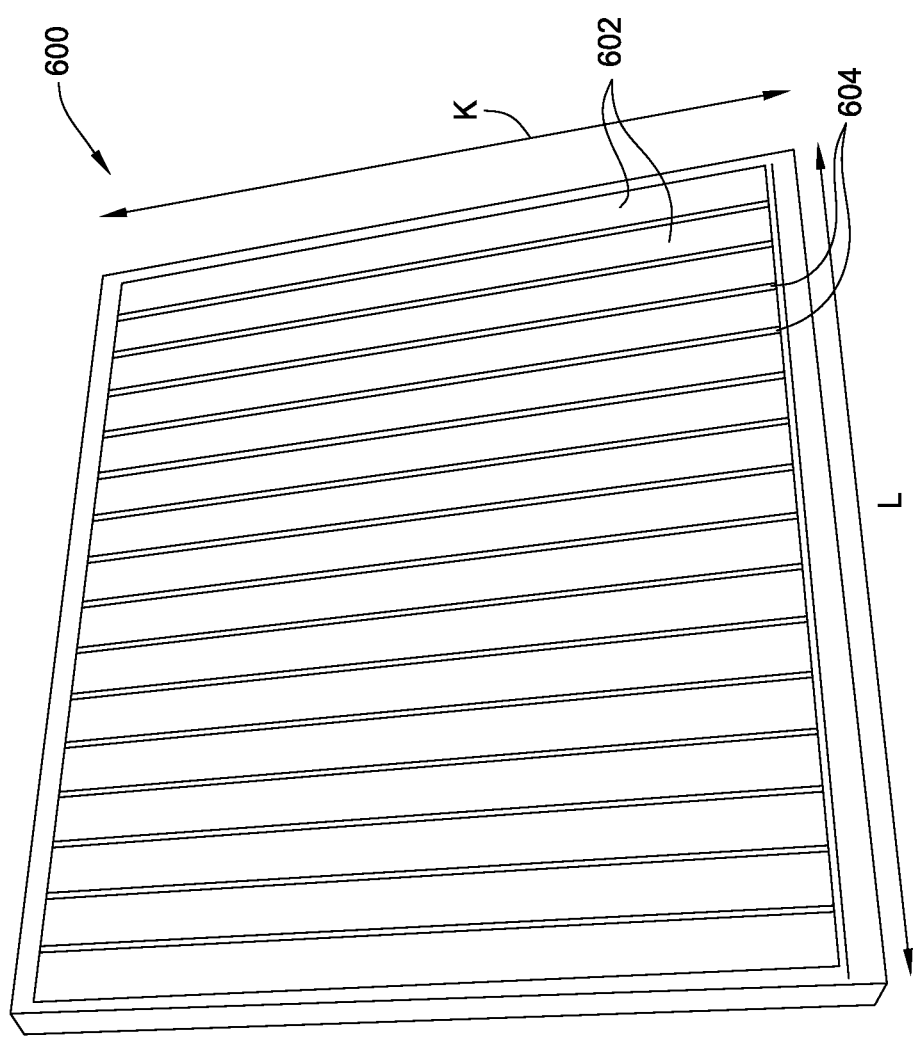
FIG. 6 is a schematic top view of a coated chamber surface according to one embodiment.

FIG. 6 is a schematic top view of a coated chamber surface according to one embodiment. The plate 600 shown in FIG. 6 could be the top plate or the bottom plate of an environment in the load lock chamber or any surface of a load lock chamber, including a triple slot load lock chamber as shown in FIG. 1. The top plate and the bottom plate each have the largest exposed surface areas of the elements that bound the processing area. The side pieces and end pieces are each smaller than the top plate and end plate. Additionally, the end plates have openings therethrough sized to permit a substrate to enter and exit the processing area. The side pieces have openings therethrough to permit a vacuum to be drawn in the processing area. Additionally, openings in the side pieces may permit metrology to be performed within the chamber or to introduce gas into the chamber.

In one embodiment, the body of the load lock chamber may comprise aluminum. In another embodiment, the body of the load lock chamber may comprise anodized aluminum. Both aluminum and anodized aluminum are highly reflective and have low emissivity. Aluminum has an emissivity coefficient of 0.02 at 25 degrees Celsius, 0.03 at 100 degrees Celsius, and 0.06 at 500 degrees Celsius. Anodized aluminum, on the other hand, has an emissivity coefficient of 0.11 at 199 degrees Celsius and 0.19 at 599 degrees Celsius. Aluminum is one of the most widely used materials for reflectance. Aluminum has a reflectance, on average, of greater than about 90 percent. Anodized aluminum does not reflect as much as aluminum, but the reflectance is still greater than 50 percent.

Substrates, when entering the load lock chamber from the transfer chamber, may be at a temperature elevated above the temperature of the factory interface. Thus, the load lock chamber may be used to lower the substrate temperature. With a highly reflective surface, the amount of heat transfer from the substrate may not be very good. A high emissivity coating 602 may be deposited onto the exposed surfaces of the plate 600. The high emissivity coating 602 may have a reflectance of less than about 4 percent and an emissivity coefficient of greater than about 0.19. Thus, the high emissivity coating 602 may aid in heat transfer. The high emissivity coating 602 may be sufficient to be exposed to vacuum conditions without interfering or contaminating the substrates that pass through the load lock chamber. The high emissivity coating 602 may be continuous or may be spaced by gaps 604. The high emissivity coating 602 may extend for substantially the entire width, shown by arrows "K" of the plate 600 and the width as shown by arrows "L".

Figure 7:
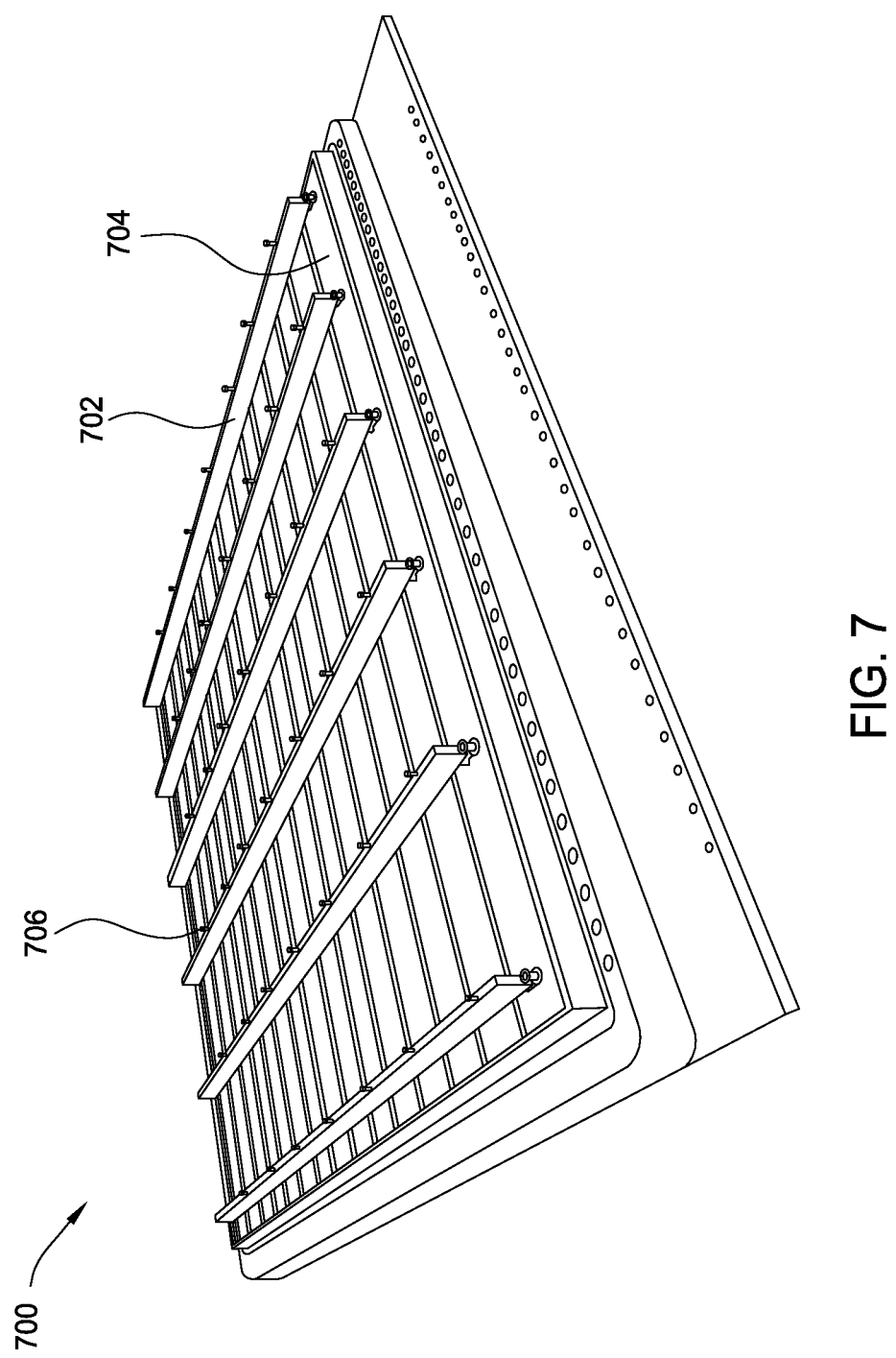
FIG. 7 is an isometric view of a coated chamber surface according to another embodiment.

FIG. 7 is an isometric view of a coated chamber surface such as a plate 700 according to another embodiment. As shown in FIG. 7, substrate supports 702 may span across the coating 704 perpendicular to the strips of coating 704. The substrate supports 702 may have one or more substrate support pins 706 extending vertically therefrom to support a substrate within the load lock chamber. The substrate is brought into the chamber by a robot having an end effector. The end effector fits between the substrate supports 702 and then lowers until the substrate rests on the substrate support pins 706.

It is to be understood that while the embodiments disclosed herein have referenced a load lock chamber for welding and for the high emissivity coating, the welding and the high emissivity coating may be used in other chambers such as transfer chambers and processing chambers. Additionally, the welding may be used to fabricate a chamber even if the chamber is not lined with a high emissivity coating. Similarly, the chamber may be lined with a high emissivity coating even if the chamber is not fabricated by the welding technique disclosed herein. In one embodiment, the chamber includes both a high emissivity coating as well as the welded concept disclosed herein.

By coating one or more surfaces within a chamber with a high emissivity coating, heat transfer from the substrate may occur at a faster rate a compared to an exposed, bare aluminum or anodized aluminum surface. Additionally, the electron beam welding separate pieces together at a location spaced from the corner, the body of the chamber may be formed in a more cost effective manner so that larger forging equipment is not necessary.

While the foregoing is directed to embodiments of the present invention, other and further embodiments of the invention may be devised without departing from the basic scope thereof, and the scope thereof is determined by the claims that follow.

The invention claimed is:

1. A chamber body comprising a plurality of pieces coupled together to collectively form the chamber body having an inside surface with four corners, the chamber body comprising:
   a first piece comprising:
      a first portion having a first length greater than a first width and a first opening extending therethrough;
      a first flange extending a first distance from the first portion in a direction substantially perpendicular to the first width, the first flange extending from a first corner of the four corners; and
      a second flange extending a second distance from the first portion in a direction substantially perpendicular to the first width, the second flange extending from a second corner of the four corners;
   a second piece coupled to the first flange and extending in a direction substantially perpendicular to the first width;

a third piece coupled to the second flange and extending in a direction substantially perpendicular to the first width and parallel to the second piece;

a fourth piece coupled to the second piece and the third piece, the fourth piece comprising:
　a second portion having a second length greater than a second width and a second opening extending therethrough;
　a third flange extending a third distance from the second potion in a direction substantially perpendicular to the second width; and
　a fourth flange extending a fourth distance from the second portion in a direction substantially perpendicular to the second width;

a first plate coupled to the first piece, the second piece, the third piece and the fourth piece;

a second plate coupled to the first piece, the second piece, the third piece and the fourth piece such that the first plate, the second plate, the first piece, the second piece, the third piece and the fourth piece collectively enclose a chamber volume; and a coating disposed on at least one of the first plate and the second plate, the coating having an emissivity that is greater than the emissivity of at least one of the first piece, the second piece, the third piece and the fourth piece.

2. The chamber body of claim 1, wherein the first flange has a width that is less than the first width, and the width of the first flange is substantially equal to a width of the second piece.

3. The chamber body of claim 2, wherein at least one corner of the four corners is rounded.

4. The chamber body of claim 3, wherein the coating has an emissivity of greater than 0.19 measured at 599 degrees Celsius and a reflectance of less than about 4 percent.

5. The chamber body of claim 4, wherein the coating comprises aluminum.

6. A chamber, comprising:
　a top plate;
　a bottom plate disposed opposite the top plate;
　a first side plate coupled to the top plate and the bottom plate;
　a second side plate coupled to the top plate and the bottom plate and disposed opposite to the first side plate;
　a first slit valve plate coupled to the top plate, the bottom plate, the first side plate and the second side plate and having an opening therethrough;
　a second slit valve plate coupled to the top plate, the bottom plate, the first side plate and the second side plate, the second slit valve plate disposed opposite the first slit valve plate and having an opening therethrough, the top plate, the bottom plate, the first and second side plates, and the first and second slit valve plates collectively enclose a chamber volume; and
　a coating disposed on at least one of the top plate and bottom plate, the coating having a first emissivity that is greater than 0.19 measured at 599 degrees Celsius.

7. The chamber of claim 6, wherein the first emissivity is different than the emissivity of at least one of the first side plate, the second side plate, the first slit valve plate and the second slit valve plate.

8. The chamber of claim 7, wherein the bottom plate has a coating thereon with an emissivity greater than 0.19 measured at 599 degrees Celsius.

9. The chamber of claim 8, wherein the coating on the bottom plate is non continuous such that one or more gaps are present.

10. The chamber of claim 9, further comprising one or more substrate supports coupled to the bottom plate and extending along the bottom plate substantially perpendicular to the one or more gaps.

11. The chamber of claim 10, further comprising one or more support pins coupled to and extending vertically from the one or more substrate supports.

12. The chamber of claim 11, wherein the coating has a reflectance of less than about 4 percent.

13. The chamber of claim 12, wherein the first slit valve plate comprises:
　a first portion having a first length greater than a first width and a first opening extending therethrough;
　a first flange extending a first distance from the first portion in a direction substantially perpendicular to the first width, the first flange extending from a first corner of the four corners; and
　a second flange extending a second distance from the first portion in a direction substantially perpendicular to the first width, the second flange extending from a second corner of the four corners;

wherein the second slit valve plate comprises:
　a second portion a second length greater than a second width and a second opening extending therethrough;
　a third flange extending a third distance from the second potion in a direction substantially perpendicular to the second width; and
　a fourth flange extending a fourth distance from the second portion in a direction substantially perpendicular to the second width; and wherein the first side plate is coupled to the first flange and extends in a direction substantially perpendicular to the first width and wherein the second side plate is coupled to the second flange and extending in a direction substantially perpendicular to the first width and parallel to the second piece.

14. The chamber of claim 13, wherein the first flange has a width that is less than the first width, and the width of the first flange is substantially equal to a width of the second side plate.

15. The chamber of claim 14, wherein at least one corner of the four corners is rounded.

* * * * *